United States Patent [19]
Nishikawa

[11] Patent Number: 5,039,203
[45] Date of Patent: Aug. 13, 1991

[54] OPTICAL WINDOW MEMBER AND METHOD FOR PRODUCTION THEREOF

[75] Inventor: Akira Nishikawa, Tokyo, Japan

[73] Assignee: Seiko Instruments Inc., Japan

[21] Appl. No.: 477,306

[22] Filed: Feb. 8, 1990

[30] Foreign Application Priority Data

Feb. 8, 1989 [JP] Japan .................................. 1-29165

[51] Int. Cl.⁵ .............................................. G02B 5/00
[52] U.S. Cl. .................................. 359/894; 359/900; 359/893; 430/5; 51/307
[58] Field of Search ................. 350/319, 1.1, 1.6, 320, 350/321, 322, 417; 430/5, 6; 51/307; 83/171

[56] References Cited

U.S. PATENT DOCUMENTS

| | | | |
|---|---|---|---|
| 4,296,143 | 10/1981 | Franken et al. | 350/417 |
| 4,319,889 | 3/1982 | Villalobos | 51/307 |
| 4,421,386 | 12/1983 | Podgorski | 350/319 |
| 4,466,938 | 8/1984 | Gigl et al. | 51/307 |
| 4,704,342 | 11/1987 | Lehrer et al. | 430/5 |

Primary Examiner—Bruce Y. Arnold
Assistant Examiner—Loha Ben
Attorney, Agent, or Firm—Bruce L. Adams; Van C. Wilks

[57] ABSTRACT

An optical window member comprises a substrate having a multiplicity of through-holes, and a diamond film formed on one surface of the substrate and covering the through-holes. A method for producing the optical window member comprises forming a thin film of diamond on one surface of the substrate, imparting a pattern to a photoresist layer formed on the substrate for partially exposing the substrate, and removing the exposed part of the substrate by etching thereby partially forming a diamond monolayer region. The thus obtained substrate possessing a multiplicity of through-holes assumes a lattice-like form, gives shape to the diamond monolayer region and, at the same time, prevents the thin diamond film from being warped or curved, and imparts improved compression strength to the diamond film and protects the diamond film against fracture.

20 Claims, 1 Drawing Sheet

OPTICAL WINDOW MEMBER AND METHOD FOR PRODUCTION THEREOF

BACKGROUND OF THE INVENTION

This invention relates to a window member to be used in an optical device such as a system employing ultraviolet light, visible radiation, infrared radiation, or X-rays.

The optical window member of this invention comprises a diamond film reinforced with a lattice-like substrate. To obtain this window member, there is employed a manufacturing method which comprises forming a diamond film on a substrate and etching the central part of the substrate in a lattice-like pattern by a photolithographic technique. This method allows an addition to the surface area of the window member and a reduction in the cost thereof and enhances the compression strength thereof.

As widely known, diamond excels in perviousness to light in a wide range extending from the ultraviolet region of about 0.3 μm in wavelength to the far infrared region of about 25 μm in wavelength and, because of its configuration of carbon atoms of a small atomic number, preeminently excels in perviousness to X-rays. It further exhibits high heatproofness up to about 1,200° C. in vacuum and up to about 600° C. in the air. Thus, it is expected to find extensive utility as optical window members.

Conventional manufacture of an optical window made of diamond involves preparing from a raw material of natural or synthetic diamond a disk several mm in diameter and mechanically grinding the diamond disc to a sufficient thinness. However, since diamond crystals of large diameters occur rarely and are extremely expensive, it is very difficult to produce an optical window made of diamond with a large surface area (at least 1 cm in diameter, for example). Moreover, the manufacture by grinding entails a disadvantage in that the work of machining is extremely expensive because diamond is the hardest of all substances.

SUMMARY OF THE INVENTION

An object of this invention is the production of an optical window member made of diamond that is free from the problems of the conventional manufacturing techniques, is inexpensive, is capable of acquiring a large surface area, and is excellent in perviousness to light.

The optical window member of this invention comprises a diamond film reinforced with a lattice-like substrate. To obtain this window member, there is employed a manufacturing method which comprises forming a diamond film on a substrate and etching the central part of the substrate in a lattice-like pattern by a photolithographic technique. This method allows an addition to the surface area of the window member and a reduction in the cost thereof and enhances the compression strength thereof.

The optical window member is composed of a substrate possessing a multiplicity of through-holes, for example pores, and a diamond film formed on one surface of the substrate and adapted to cover the pores. The inventive method includes forming a thin film of diamond on one surface of the substrate, applying photoresist to another surface of the substrate, imparting to the applied photoresist a pattern for partially exposing the substrate, and removing the exposed part of the substrate by etching, thereby partially forming a diamond monolayer region.

Thus, the optical window member of this invention is composed of a substrate possessing a multiplicity of pores and a thin film of diamond. The substrate possessing a multiplicity of pores assumes a lattice-like form, gives shape to the diamond monolayer region and, at the same time, prevents the diamond film from being warped or curved. This also imparts improved compression strength to the diamond film and protects the diamond film against fracture.

The formation of the diamond film may be effected by any of the known methods such as, for example, hot CVD method, plasma CVD method, optical CVD method, ionized vacuum deposition method, ion beam method, and plasma jet method. Which of these methods is employed is not particularly critical. The method of this invention produces a thin diamond film in a conspicuously large surface area and allows a significant reduction in production cost as compared with the optical member manufactured by the conventional method which comprises machining a diamond crystal.

DETAILED DESCRIPTION OF THE INVENTION

Figure 1A:
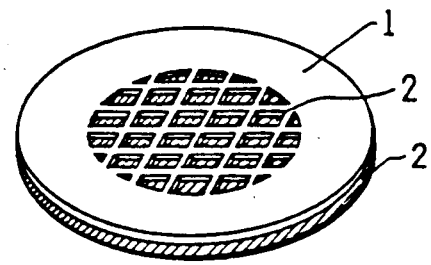
FIGS. 1(A) to 1(C) are perspective views of an optical window member with a diamond film according to this invention.

In the drawings, 1 denotes a substrate, 2 a diamond film, 3 a photoresist, 4 a photomask, and 5 ultra-violet light.

A working example of this invention will be described below with reference to the accompanying drawings. FIGS. 2(A) to 2(F) are explanatory diagrams illustrating a process for production according to the present invention.

Figure 2A:
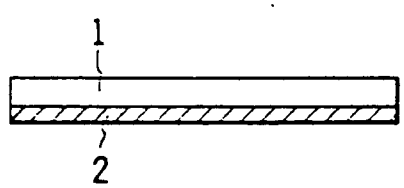
FIG. 2(A) to 2(F) are explanatory diagrams illustrating a process for the production of the optical window member of this invention.

First, as illustrated in FIG. 2(A), a Si substrate 1 measuring 50 mm in diameter and 200 μm in thickness is prepared. On one surface of the substrate 1, a diamond film 2 having a thickness of 4 μm is deposited by the microwave plasma CVD method (Japanese Patent Application Disclosure SHO 58(1983)-110,494) under the conditions of synthesis shown in Table 1.

TABLE 1

| | |
|---|---|
| Composition of raw material gas | $H_2 + CH_4$ |
| Flow volume rate of raw material gas | $CH_4/H_2 = 0.1 \sim 3.0$ vol % |
| Gas pressure | 30~40 Torr |
| Frequency of microwave | 2.45 GHz |
| Output of microwave | 300~500 W |

Figure 2D:
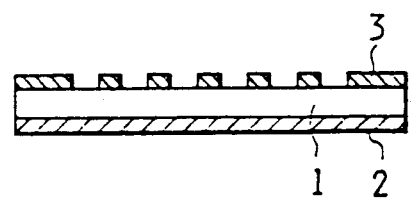
Figure 2B:
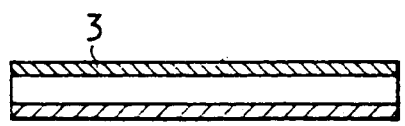

Next, as shown in FIG. 2(B), photoresist 3 is applied to the other surface of the Si substrate 1 opposite to the surface having deposited thereon the diamond film 2. The applied photoresist 3 is exposed to ultraviolet radiation 5 through a patterned photomask 4 having a lattice-like pattern formed therein in advance as illustrated in FIG. 2(C).

Next, through the developing, rinsing, and post-baking treatments, a lattice-like pattern is formed in the photoresist 3 as illustrated in FIG. 2(D).

Figure 2E:
Figure 2C:
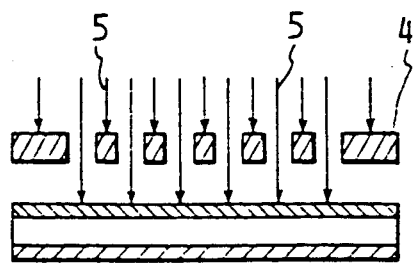

Next, the substrate 1 is immersed in a mixed acid bath of HF+HNO$_3$ to remove that portion of the Si substrate 1 exposed in the lattice-like pattern by etching so as to form a monolayer region of diamond film, namely an exposed part of the diamond film 2 as illustrated in FIG. 2(E).

Figure 1B:
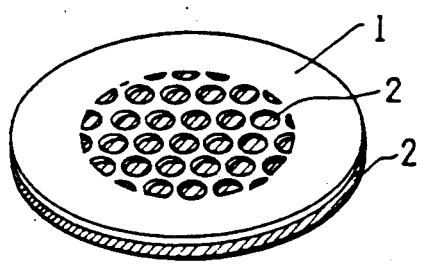
Figure 1C:
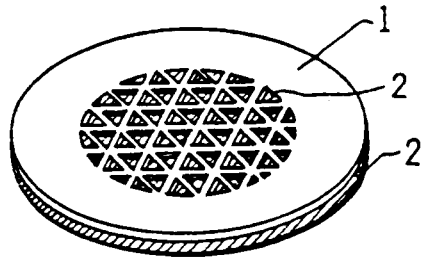
Figure 2F:
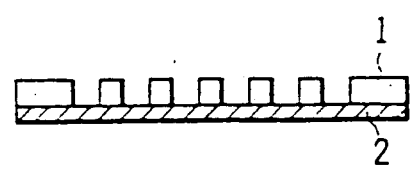

Finally, as illustrated in FIG. 2(F), the photoresist 3 is peeled off to produce an optical window member in which the Si substrate 1 remains in the lattice-like pattern in the central part to reinforce the window part of the diamond film 2 as illustrated in FIGS. 1(A) to 1(C). The window member obtained in this example is of such size that the outside diameter of the Si substrate is 50 mm, the inside diameter of the window part is 30 mm, the gap intervals of the Si latticework are 5 mm, the width of Si laths is 0.6 mm, the thickness of the Si substrate is 200 $\mu$m, and the thickness of the diamond film is 4 $\mu$m.

A sample of a window member prepared as above was tested for ability to withstand the atmospheric pressure (1 atmosphere) by a method consisting of setting the window member in place in a window fitting part on the outer wall of a vacuum chamber and creating a vacuum in the interior of the vacuum chamber. During the test, the diamond film did not fracture nor did the window member leak, proving that the window member possessed strength enough to sufficiently withstand atmospheric pressure.

As shown in FIG. 1(A), the lattice-like region of the substrate 1 may be formed of through-holes having a rectangular shape. The through-holes may have other shapes, such as circular (FIG. 1(B)) or triangular (FIG. 1(C)).

The arrangement of the through-holes to be formed by etching in the substrate is not required to be limited to the lattice-like pattern.

As described above, this invention allows a generous addition to the surface area of the optical window member of diamond and a reduction in cost of raw material and cost of production as well.

Moreover, since the substrate remains in the form of a lattice-like frame in the window with a diamond film monolayer, the lattice inhibits the diamond film from being warped or curved, serves as a reinforcing material, enhances the compression strength of the window part, and protects the window part against fracture. Thus, the present invention enables a diamond film excelling in perviousness to light in a wide range and exhibiting a highly satisfactory transmittance to X-rays of low energy to be utilized advantageously as an optical window member.

What is claimed is:

1. A method for producing an optical window member, comprising the steps of: forming a thin film of diamond on one surface of a substrate, applying photoresist to another surface of said substrate, forming a pattern for partially exposing said substrate in said applied photoresist, and removing the exposed part of said substrate by etching thereby partially forming a monolayer region of diamond.

2. An optical window member, comprising: a substrate possessing a plurality of pores, and a diamond film formed on one surface of said substrate and covering said pores.

3. A method for producing an optical window member, comprising the steps of: providing a substrate having two opposed major surfaces; forming a diamond film on one of the substrate major surfaces; and then forming a pattern of through-holes in the substrate but not in the diamond film to thereby form an optical window member.

4. A method according to claim 3; wherein the step of forming a pattern comprises forming a pattern of through-holes in a central region of the substrate.

5. A method according to claim 3; wherein the step of forming a pattern comprises etching the substrate by photolithography.

6. A method according to claim 5; wherein the etching of the substrate by photolithography comprises forming a photoresist layer on the other one of the substrate major surfaces, exposing the photoresist layer through a patterned photomask, removing the exposed portion of the photoresist layer, and etching the substrate using the remaining unexposed portion of the photoresist layer as a mask to thereby form the pattern of through-holes in the substrate.

7. An optical window member comprising: a substrate having two opposed major surfaces and having a plurality of through-holes extending therethrough from one major surface to the other major surface; and a diamond film disposed on one of the substrate major surfaces and covering the through-holes.

8. An optical window member according to claim 7; wherein the through-holes are configured and arranged to define a lattice-like region of the substrate effective to reinforce the diamond film.

9. An optical window member according to claim 8; wherein the through-holes have a circular shape.

10. An optical window member according to claim 8; wherein the through-holes have a triangular shape.

11. An optical window member according to claim 8; wherein the through-holes have a rectangular shape.

12. An optical window member according to claim 8; wherein the lattice-like region is at the central part of the substrate.

13. An optical window member according to claim 8; wherein the diamond film has a thickness on the order of 4 $\mu$m.

14. An optical window member according to claim 8; wherein the substrate is composed of silicon.

15. An optical window member according to claim 14; wherein the silicon substrate has a thickness on the order of 200 $\mu$m.

16. An optical window member according to claim 8; wherein the lattice-like region of the substrate is effective to enable the diamond film to withstand a pressure of 1 atmosphere without fracturing.

17. An optical window member according to claim 7; wherein the diamond film has a thickness on the order of 4 $\mu$m.

18. An optical window member according to claim 7; wherein the substrate is composed of silicon.

19. An optical window member according to claim 18; wherein the silicon substrate has a thickness on the order of 200 $\mu$m.

20. An optical window member according to claim 7; wherein the substrate has a circular shape.

* * * * *